(12) United States Patent
Ching et al.

(10) Patent No.: US 10,541,319 B2
(45) Date of Patent: Jan. 21, 2020

(54) FIN STRUCTURES HAVING VARIED FIN HEIGHTS FOR SEMICONDUCTOR DEVICE

(71) Applicant: Taiwan Semiconductor Manufacturing Co., Ltd., Hsinchu (TW)

(72) Inventors: Kuo-Cheng Ching, Hsinchu County (TW); Chih-Hao Wang, Hsinchu County (TW); Shi Ning Ju, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/724,519

(22) Filed: Oct. 4, 2017

(65) Prior Publication Data

US 2019/0067450 A1    Feb. 28, 2019

Related U.S. Application Data

(60) Provisional application No. 62/552,236, filed on Aug. 30, 2017.

(51) Int. Cl.

| H01L 29/66   | (2006.01) |
| H01L 21/8238 | (2006.01) |
| H01L 21/3105 | (2006.01) |
| H01L 29/78   | (2006.01) |
| H01L 21/8239 | (2006.01) |

(Continued)

(52) U.S. Cl.
CPC .. *H01L 29/66621* (2013.01); *H01L 21/31051* (2013.01); *H01L 21/8239* (2013.01); *H01L 21/823821* (2013.01); *H01L 29/41791*
(2013.01); *H01L 29/66795* (2013.01); *H01L 29/7833* (2013.01); *H01L 21/0262* (2013.01); *H01L 21/02532* (2013.01);
(Continued)

(58) Field of Classification Search
None
See application file for complete search history.

(56) References Cited

U.S. PATENT DOCUMENTS

| 6,909,147 B2 | 6/2005 | Aller et al. |
| 9,397,006 B1 | 7/2016 | Ok et al.    |

(Continued)

FOREIGN PATENT DOCUMENTS

| KR | 10-2008-0001444 | 1/2008  |
| TW |    201639015 A  | 11/2016 |

*Primary Examiner* — Eduardo A Rodela
*Assistant Examiner* — Nilufa Rahim
(74) *Attorney, Agent, or Firm* — Sterne, Kessler, Goldstein & Fox P.L.L.C.

(57) ABSTRACT

A method of forming first and second fin field effect transistors (finFETs) on a substrate includes forming first and second fin structures of the first and second finFETs, respectively, on the substrate. The first and second fin structures have respective first and second vertical dimensions that are about equal to each other. The method further includes modifying the first fin structure such that the first vertical dimension of the first fin structure is smaller than the second vertical dimension of the second fin structure and depositing a dielectric layer on the modified first fin structure and the second fin structure. The method further includes forming a polysilicon structure on the dielectric layer and selectively forming a spacer on a sidewall of the polysilicon structure.

20 Claims, 12 Drawing Sheets

(51) Int. Cl.
*H01L 29/417* (2006.01)
*H01L 21/02* (2006.01)

(52) U.S. Cl.
CPC .. *H01L 21/02576* (2013.01); *H01L 21/02579* (2013.01); *H01L 29/66545* (2013.01); *H01L 2029/7858* (2013.01)

(56) References Cited

U.S. PATENT DOCUMENTS

| | | |
|---|---|---|
| 9,577,066 B1 | 2/2017 | Al-Amoody et al. |
| 9,704,751 B1 | 7/2017 | Chang et al. |
| 9,704,974 B2 | 7/2017 | Chang et al. |
| 9,805,989 B1* | 10/2017 | Adusumilli ..... H01L 21/823814 |
| 2013/0049136 A1 | 2/2013 | Wahl et al. |
| 2013/0082304 A1* | 4/2013 | Liu ................... H01L 29/66795 257/192 |
| 2013/0161693 A1 | 6/2013 | Adam et al. |
| 2014/0239404 A1 | 8/2014 | Huang et al. |
| 2015/0001597 A1* | 1/2015 | Fryer ................ H01L 29/66795 257/288 |
| 2015/0129980 A1 | 5/2015 | Wang et al. |
| 2015/0228653 A1* | 8/2015 | Cheng ................ H01L 27/0924 257/369 |
| 2015/0340468 A1 | 11/2015 | Lim et al. |
| 2016/0104705 A1 | 4/2016 | Chung et al. |
| 2016/0260741 A1 | 9/2016 | Liu et al. |
| 2019/0067451 A1 | 2/2019 | Ching et al. |

* cited by examiner

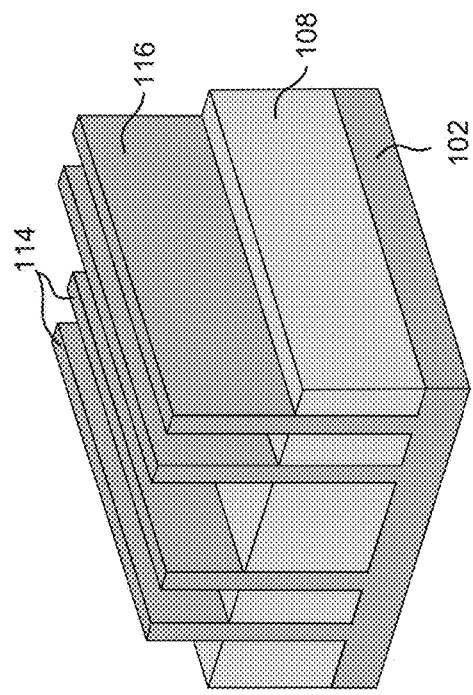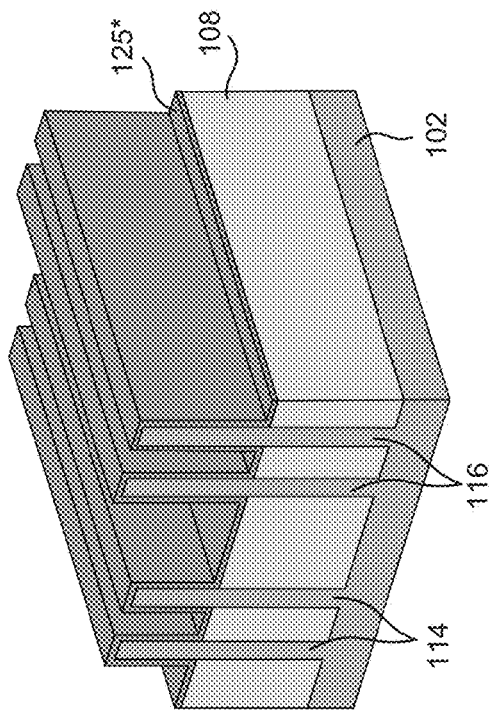
FIG. 8A  FIG. 9A
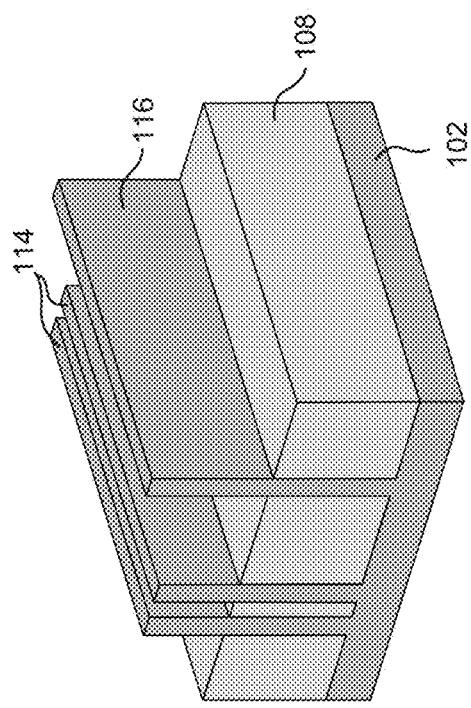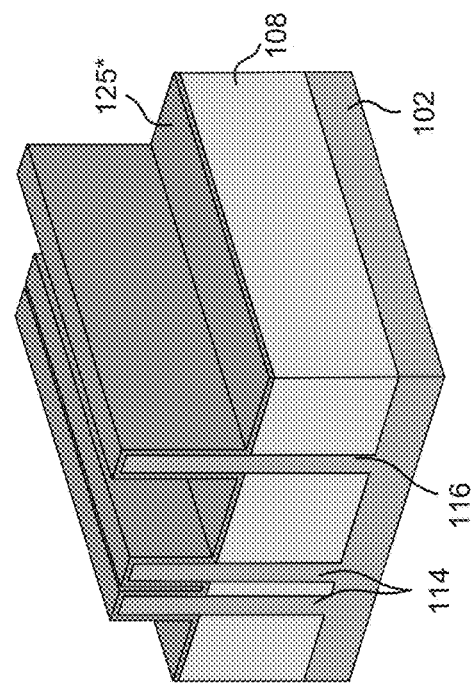
FIG. 8B  FIG. 9B

FIN STRUCTURES HAVING VARIED FIN HEIGHTS FOR SEMICONDUCTOR DEVICE

This application claims the benefit of U.S. Provisional Patent Application No. 62/552,236, titled "Fin Structure for Semiconductor Device," which was filed on Aug. 30, 2017 and is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 4A-13A are isometric views of a finFET at various stages of its fabrication process, in accordance with some embodiments.

FIGS. 4B-13B are isometric views of a finFET, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
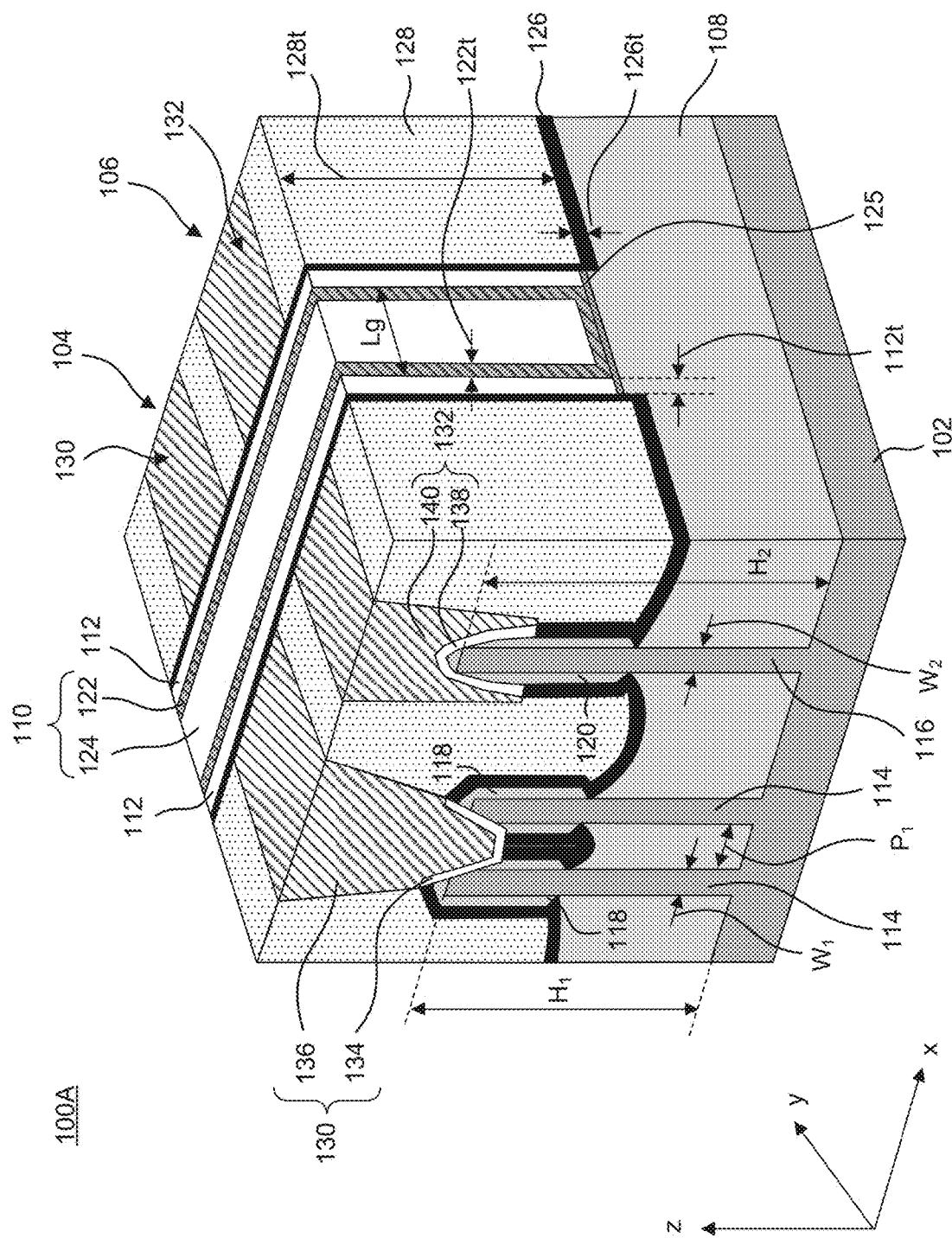
FIGS. 1A-1B and 2A-2B are isometric views of fin field effect transistors (finFETs), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

The term "about" as used herein indicates the value of a given quantity varies by ±10% of the value, unless noted otherwise.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical" means nominally perpendicular to the surface of a substrate.

As used herein, the term "critical dimension" refers to the smallest feature size (e.g., line width) of a finFET and/or an element of an integrated circuit.

As used herein, the term "substantially" indicates that the value of a given quantity varies by ±1% to ±5% of the value.

This disclosure provides example structures and methods for simultaneously fabricating semiconductor devices having different fin structures on a same substrate.

FIG. 1A is an isometric view of a device 100A, according to some embodiments. Device 100A may be included in a microprocessor, memory cell, or other integrated circuit. It will be recognized that the view of device 100A in FIG. 1A is shown for illustration purposes and may not be drawn to scale.

Device 100A may be formed on a substrate 102 and may include fin field effect transistors (FETs) 104 and 106 as shown in FIG. 1A. Device 100A may further include shallow trench isolation (STI) regions 108, gate structure 110, and spacers 112 disposed on opposite sides of gate structure 110.

In some embodiments, finFET 104 may be a multi-fin finFET having a plurality of fin structures 114 and finFET 106 may be a single-fin finFET having a fin structure 116. Even though FIG. 1A shows one multi-fin finFET 104 and one single-fin finFET 106, device 100A may have one or more multi-fin finFETs similar to finFET 104 and may have one or more single-fin finFETs similar to finFET 106. In some embodiments, multi-fin finFETs such as, for example, finFET 104 may be used for high current drive devices (e.g., current sources) because of their larger effective channel width compared to single-fin finFETs such as, for example, finFET 106. In some embodiments, single-fin finFETs such as, finFET 106 may be used for high density devices (e.g., high density memory devices) because of their smaller device area compared to multi-fin finFETs such as, for example, finFET 104.

In some embodiments, fin structures of multi-fin finFETs of device 100A may have a smaller height compared to height of fin structures of single-fin finFETs of device 100A. For example, each of fin structures 114 may have a height $H_1$ shorter than height $H_2$ of fin structure 116, according to some embodiments. In some embodiments, height $H_1$ may range from about 20 nm to about 40 nm and height $H_2$ may range from about 50 nm to about 60 nm. In some embodiments, a difference between heights $H_1$ and $H_2$ may range from about 20 nm to about 50 nm. In some embodiments, finFET 104 may have fin-to-fin pitch $P_1$ ranging from about 18 nm to about 24 nm.

The height $H_1$ and fin-to-fin pitch $P_1$ of finFET 104 may be selected such that the processing steps shared to simultaneously form one or more components (e.g., STI regions 108, polysilicon structure, gate structure 110) of finFETs 104 and 106 is suitable for processing in high aspect ratio space between adjacent fin structures 114. For example, in some embodiments, the height $H_1$ and fin-to-fin pitch $P_1$ of finFET 104 may be selected such that the shared processing steps (e.g., deposition, etching) for forming STI regions 108 and/or gate structure 110 of finFETs 104 and 106 are suitable for forming portions of STI regions 108 and/or portions of gate structure 110 in the high aspect ratio space between fin structures 114.

Substrate 102 may be a physical material on which finFETs 104 and 106 are formed. Substrate 102 may be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 may be doped depending on design requirements (e.g., p-type substrate or n-type substrate). In some embodiments, substrate 102 may be doped with p-type dopants (e.g., boron, indium, aluminum, or gallium) or n-type dopants (e.g., phosphorus or arsenic).

STI regions 108 may provide electrical isolation to finFETs 104 and 106 from each other and from neighboring active and passive elements (not illustrated herein) integrated with or deposited onto substrate 102. STI regions 108 may be made of a dielectric material. In some embodiments, STI regions 108 may include silicon oxide, silicon nitride, silicon oxynitride, fluorine-doped silicate glass (FSG), a low-k dielectric material, and/or other suitable insulating material. In some embodiments. STI regions 108 may include a multi-layered structure.

Fin structures 114 and 116 may traverse along a Y-axis and through gate structure 110. Portions of fin structures 114 and 116 extending above STI regions 108 may be wrapped around by gate structure 110. In some embodiments, fin structures 114 and 116 may include material similar to substrate 102. In some embodiments, fin structures 114 and 116 may be formed from a photolithographic patterning and an etching of substrate 102. Fin structures 114 and 116 may have respective widths $W_1$ and $W_2$ in a range from about 5 nm to about 10 nm, according to some embodiments. In some embodiments, widths $W_1$ and $W_2$ may be equal to or different from each other. Based on the disclosure herein, it will be recognized that other widths and materials for fin structures 114 and 116 are within the scope and spirit of this disclosure.

In some embodiments, epitaxial regions 118 and 120 may be grown on portions of respective fin structures 114 and 116 that extend above STI regions 108 and are not underlying gate structure 110, as illustrated in FIG. 1A. Epitaxial regions 118 and 120 may include an epitaxially-grown semiconductor material. In some embodiments, the epitaxially grown semiconductor material is the same material as the material of substrate 102. In some embodiments, the epitaxially-grown semiconductor material includes a different material from the material of substrate 102. The epitaxially-grown semiconductor material may include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. In some embodiments, epitaxial regions 118 and 120 may each have a thickness in a range from about 5 nm to about 15 nm around respective portions of fin structures 114 and 116 above STI regions 108.

In some embodiments, epitaxial regions 118 and 120 may be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial regions 118 and 120 may be grown by an epitaxial deposition/partial etch process, which repeats the epitaxial deposition/partial etch process at least once. Such repeated deposition/partial etch process is also called a "cyclic deposition-etch (CDE) process." In some embodiments, epitaxial regions 118 and 120 may be grown by selective epitaxial growth (SEG), where an etching gas is added to promote the selective growth of semiconductor material on the exposed surfaces of fin structures 114 and 116, but not on insulating material (e.g., dielectric material of STI regions 108).

In some embodiments, both epitaxial regions 118 and 120 may be p-type or n-type. In some embodiments, epitaxial regions 118 and 120 may be of opposite doping type with respect to each other. In some embodiments, p-type epitaxial regions 118 and 120 may include SiGe and may be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used.

In some embodiments, each of p-type epitaxial regions 118 and 120 may have a plurality of sub-regions (not shown) that may include SiGe and may differ from each other based on, for example, doping concentration, epitaxial growth process conditions, and/or relative concentration of Ge with respect to Si. In some embodiments, each of the sub-regions may have thicknesses similar to or different from each other and thicknesses may range from about 0.5 nm to about 5 nm. In some embodiments, the atomic percent Ge in sub-regions closest to a top surface of fin structures 114 and 116 may be smaller than the atomic percent Ge in sub-regions farthest from the top surface of fin structures 114 and 116. In some embodiments, the sub-regions closest to the top surface of fin structures 114 and 116 may include Ge in a range from about 15 atomic percent to about 35 atomic percent, while the sub-regions farthest from the top surface of fin structures 114 and 116 may include Ge in a range from about 25 atomic percent to about 50 atomic percent with any remaining atomic percent being Si in the sub-regions.

The plurality of sub-regions of p-type epitaxial regions 118 and 120 may be epitaxially grown under a pressure of about 10 Torr to about 300 Torr and at a temperature of about 500° C. to about 700° C. using reaction gases such as HCl as an etching agent, GeH4 as Ge precursor, dichlorosilane (DCS) and/or SiH4 as Si precursor, B2H6 as B dopant precursor, H2, and/or N2. To achieve different concentration of Ge in the plurality of sub-regions, the ratio of a flow rate of Ge to Si precursors may be varied during their respective growth process, according to some embodiments. For example, a Ge to Si precursor flow rate ratio in a range from about 9 to about 25 may be used during the epitaxial growth of the sub-regions closest to the top surface of fin structures 114 and 116, while a Ge to Si precursor flow rate ratio less than about 6 may be used during the epitaxial growth of the sub-regions farthest from the top surface of fin structures 114 and 116.

The plurality of sub-regions of p-type epitaxial regions 118 and 120 may have varying p-type dopant concentration with respect to each other, according to some embodiments. For example, the sub-regions closest to the top surface of fin structures 114 and 116 may be undoped or may have a dopant concentration lower (e.g., dopant concentration less than about $8 \times 10^{20}$ atoms/$cm^3$) than the dopant concentrations (e.g., dopant concentration in a range from about $1 \times 10^{20}$ to about $3 \times 10^{22}$ atoms/$cm^3$) of the sub-regions farthest from the top surface of fin structures 114 and 116.

In some embodiments, n-type epitaxial regions 118 and 120 may include Si and may be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used. In some embodiments, each of n-type epitaxial regions 118 and 120 may have a plurality of n-type sub-regions. Except for the type of dopants, the plurality of n-type sub-regions may be similar to the plurality of p-type sub-regions, in thickness, relative Ge concentration with respect to Si, dopant concentration, and/or epitaxial growth process conditions.

Based on the disclosure herein, it will be recognized that other materials, thicknesses, Ge concentrations, and dopant concentrations for the plurality of n-type and/or p-type sub-regions are within the scope and spirit of this disclosure.

Fin structures 114 and 116 are current-carrying structures for respective finFETs 104 and 106. Epitaxial regions 118 and 120 along with the portions of fin structures 114 and 116 covered by respective epitaxial regions 114 and 116 are configured to function as source/drain (S/D) regions of respective finFETs 104 and 106. Channel regions (not shown) of finFETs 104 and 106 may be formed in portions of their respective fin structures 114 and 116 underlying gate structure 110.

Gate structure 110 may include a dielectric layer 122 and a gate electrode 124. Additionally, in some embodiments, gate structure 110 may include another dielectric layer 125. Gate structure 110 may have a horizontal dimension (e.g., gate length) Lg that ranges from about 5 nm to about 30 nm, according to some embodiments. Gate structure 110 may be formed by a gate replacement process.

In some embodiments, dielectric layer 122 is adjacent to and in contact with gate electrode 124. Dielectric layer 122 may have a thickness 122t in a range of about 1 nm to about 5 nm. Dielectric layer 122 may include silicon oxide and may be formed by CVD, atomic layer deposition (ALD), physical vapor deposition (PVD), e-beam evaporation, or other suitable process. In some embodiments, dielectric layer 122 may include (i) a layer of silicon oxide, silicon nitride, and/or silicon oxynitride, (ii) a high-k dielectric material such as, for example, hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers may be formed by ALD and/or other suitable methods. In some embodiments, dielectric layer 122 may include a single layer or a stack of insulating material layers. Based on the disclosure herein, it will be recognized that other materials and formation methods for dielectric layer 122 are within the scope and spirit of this disclosure.

In some embodiments, dielectric layer 125 may be formed as an interlayer between STI regions 108 and spacers 112 and between STI regions 108 and gate structure 110. Dielectric layer 125 may have a composition similar to dielectric layer 122. In some embodiments, dielectric layers 122 and 125 may function as gate dielectric layers of gate structure 110. In some embodiments, dielectric layer 125 may have a thickness smaller than thickness 122t of dielectric layer 122.

Gate electrode 124 may include a gate work function metal layer (not shown) and a gate metal fill layer (not shown). In some embodiments, gate work function metal layer is disposed on dielectric layer 122. The gate work function metal layer may include a single metal layer or a stack of metal layers. The stack of metal layers may include metals having work functions similar to or different from each other. In some embodiments, the gate work function metal layer may include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer may be formed using a suitable process such as ALD, CVD, PVD, plating, or combinations thereof. In some embodiments, the gate work function metal layer has a thickness in a range from about 2 nm to about 15 nm. Based on the disclosure herein, it will be recognized that other materials, formation methods, and thicknesses for the gate work function metal layer are within the scope and spirit of this disclosure.

The gate metal fill layer may include a single metal layer or a stack of metal layers. The stack of metal layers may include metals different from each other. In some embodiments, the gate metal fill layer may include a suitable conductive material such as, for example, Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layer may be formed by ALD, PVD, CVD, or other suitable deposition process. Based on the disclosure herein, it will be recognized that other materials and formation methods for the gate metal fill layer are within the scope and spirit of this disclosure.

Spacers 112 may form sidewalls of gate structure 110 and are in contact with dielectric layer 122. Spacers 112 may include insulating material such as, for example, silicon oxide, silicon nitride, a low-k material, or a combination thereof. Spacers 112 may have a low-k material with a dielectric constant less than 3.9 (e.g., less than 3.5, 3, or 2.8). In some embodiments, each of spacers 112 may have a thickness 112t in a range from about 7 nm to about 10 nm. Based on the disclosure herein, it will be recognized that other materials and thicknesses for spacers 112 are within the scope and spirit of this disclosure.

Referring back to FIG. 1A, device 100A may further include etch stop layer (ESL) 126, interlayer dielectric (ILD) 128, and source/drain (S/D) contact structures 130 and 132 of respective finFETs 104 and 106, according to some embodiments.

ESL 126 may be configured to protect gate structure 110 and/or portions of epitaxial regions 118 and 120 that are not in contact with source/drain (S/D) contact structures 130 and 132. This protection may be provided, for example, during formation of ILD layer 128 and/or S/D contact structures 130 and 132. ESL 126 may be disposed on sides of spacers 112. In some embodiments, ESL 126 may include, for example, silicon nitride ($SiN_x$), silicon oxide ($SiO_x$), silicon oxynitride (SiON), silicon carbide (SiC), silicon carbonitride (SiCN), boron nitride (BN), silicon boron nitride (SiBN), silicon carbon boron nitride (SiCBN), or a combination thereof. In some embodiments, ESL 126 may include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 126 has a thickness 126t in a range from about 3 nm to 10 nm or from about 10 nm to about 30 nm. Based on the disclosure herein, it will be recognized that other materials, formation methods, and thicknesses for ESL 126 are within the scope and spirit of this disclosure.

ILD layer 128 may be disposed on ESL 126 and may include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited using flowable CVD (FCVD). In some embodiments, the dielectric material is silicon oxide. In some embodiments, ILD layer 128 may have a thickness 128t in a range from about 50 nm to about 200 nm. Based on the disclosure herein, it will be recognized that other materials, thicknesses, and formation methods for ILD layer 128 are within the scope and spirit of this disclosure.

S/D contact structures 130 and 132 may be configured to electrically connect respective S/D regions of finFETs 104 and 106 to other elements of device 100A and/or of the integrated circuit. S/D contact structures 130 and 132 may be formed within ILD layer 128. S/D contact structure 130 may include a metal silicide layer 134 and a conductive region 136 over metal silicide layer 134, and S/D contact structure 132 may include a metal silicide layer 138 and a conductive region 140 over metal silicide layer 138. In some embodiments, there may be conductive liners (not shown) between metal silicide layer 134 and conductive region 136 and between metal silicide layer 138 and conductive region 140. The conductive liners may be configured as diffusion barriers to prevent diffusion of unwanted atoms and/or ions into S/D regions of finFETs 104 and 106 during formation of conductive regions 136 and 140. In some embodiments, the conductive liners may include a single layer or a stack of conductive materials such as, for example, TiN, Ti, Ni, TaN, Ta, or a combination thereof. In some embodiments, the conductive liners may act as an adhesion-promoting-layer, a glue-layer, a primer-layer, a protective-layer, and/or a nucleation-layer. The conductive liners may have a thickness in a range from about 1 nm to about 2 nm, according to some embodiments.

In some embodiments, silicide layers 134 and 138 may include metal silicides and may provide a low resistance interface between respective conductive regions 136 and 140 and corresponding S/D regions of finFETs 104 and 106. Examples of metal used for forming the metal silicides are Co, Ti, or Ni.

In some embodiments, conductive regions 136 and 140 may include conductive materials such as, for example, W, Al, or Co. In some embodiments, conductive regions 136 and 140 may each have an average horizontal dimension (e.g., width) in a range from about 15 nm to about 25 nm and may each have an average vertical dimension (e.g., height) in a range from about 400 nm to about 600 nm. Based on the disclosure herein, it will be recognized that other materials and dimensions for conductive liners, silicide layers 134 and 138, and conducive regions 136 and 140 are within the scope and spirit of this disclosure.

Figure 1B:
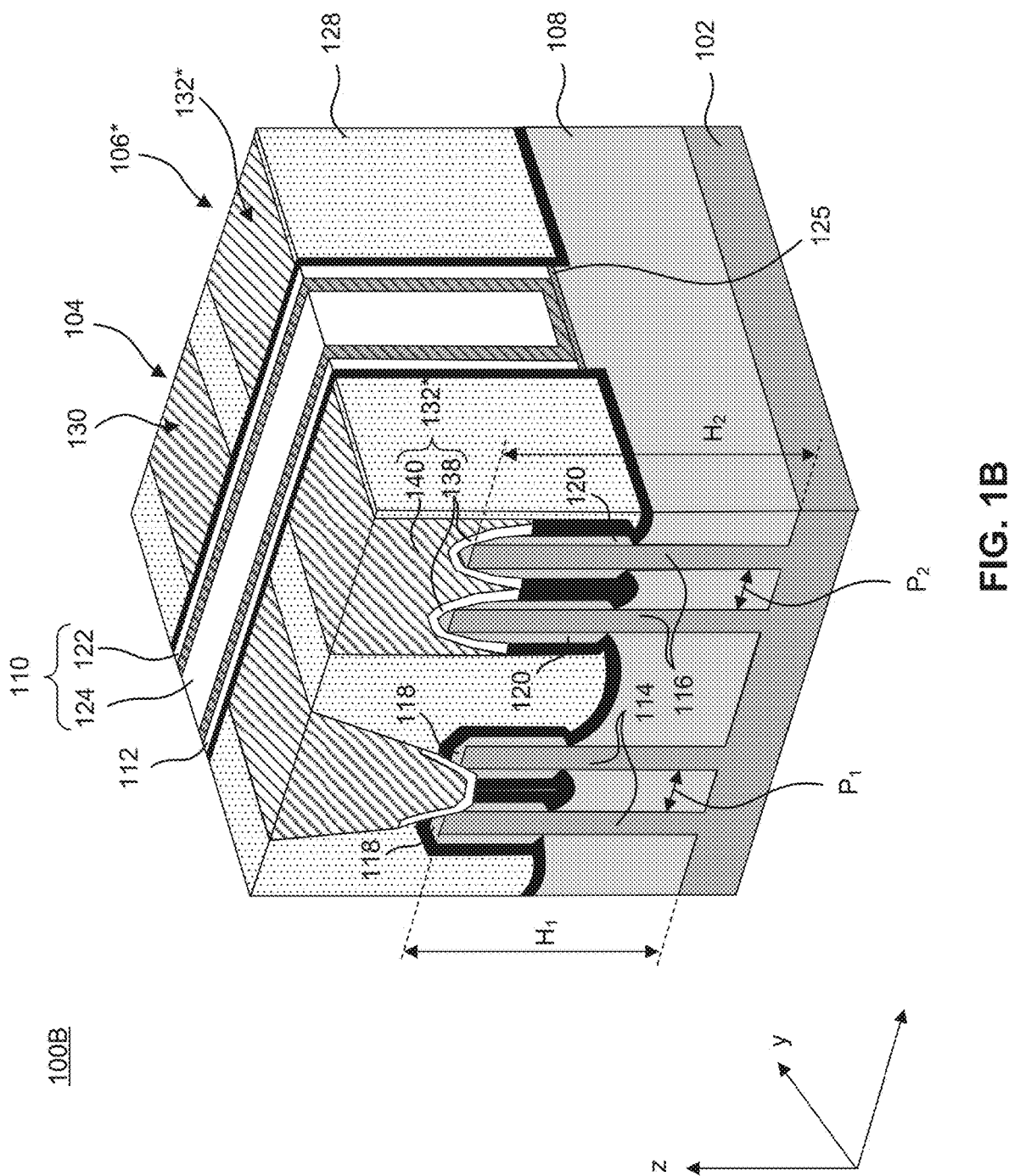

FIG. 1B is an isometric view of a device 100B, according to some embodiments. Elements in FIG. 1B with the same annotations as elements in FIG. 1A are described above. Device 100B may be included in a microprocessor, memory cell, or other integrated circuit. It will be recognized that the view of device 100B in FIG. 1B is shown for illustration purposes and may not be drawn to scale.

Device 100B may be formed on a substrate 102 and may include finFETs 104 and 106* as shown in FIG. 1B. Device 100A may further include shallow trench isolation (STI) regions 108, gate structure 110, spacers 112 disposed on opposite sides of gate structure 110, ESL 126, ILD layer 128, and contact structures 130 and 132*. The above discussion of finFET 106 and contact structure 132* applies to respective finFET 106* and contact structure 132* unless mentioned otherwise.

In some embodiments, finFET 104 may be a multi-fin finFET having a plurality of fin structures 114 and finFET 106* may be a multi-fin finFET having fin structures 116. Even though FIG. 1B shows one multi-fin finFET 104 and one multi-fin finFET 106*, device 100B may have one or more multi-fin finFETs similar to finFETs 104 and 106*. In some embodiments, each of fin structures 114 of finFET 104 may have a smaller height $H_1$ compared to a height $H_2$ of each of fin structures 116 of finFET 106* of device 100B. In some embodiments, height $H_1$ may range from about 20 nm to about 40 nm and height $H_2$ may range from about 50 nm to about 60 nm. In some embodiments, a difference between heights $H_1$ and $H_2$ may range from about 20 nm to about 50 nm. In some embodiments, a fin-to-fin pitch $P_1$ of finFET 104 may be smaller compared to a fin-to-fin pitch $P_2$ of finFET 106*. In some embodiments, fin-to-fin pitch $P_1$ may range from about 18 nm to about 24 nm and fin-to-fin pitch $P_2$ may range from about 24 nm to about 34 nm.

The heights and fin-to-fin pitches of finFETs 104 and 106* may be selected such that the processing steps shared to simultaneously form one or more components (e.g., STI regions 108, polysilicon structure, gate structure 110) of finFETs 104 and 106* is suitable for processing in high aspect ratio space between adjacent fin structures 114 of finFET 104 and between adjacent fin structures 116 of finFET 106*.

Figure 2A:
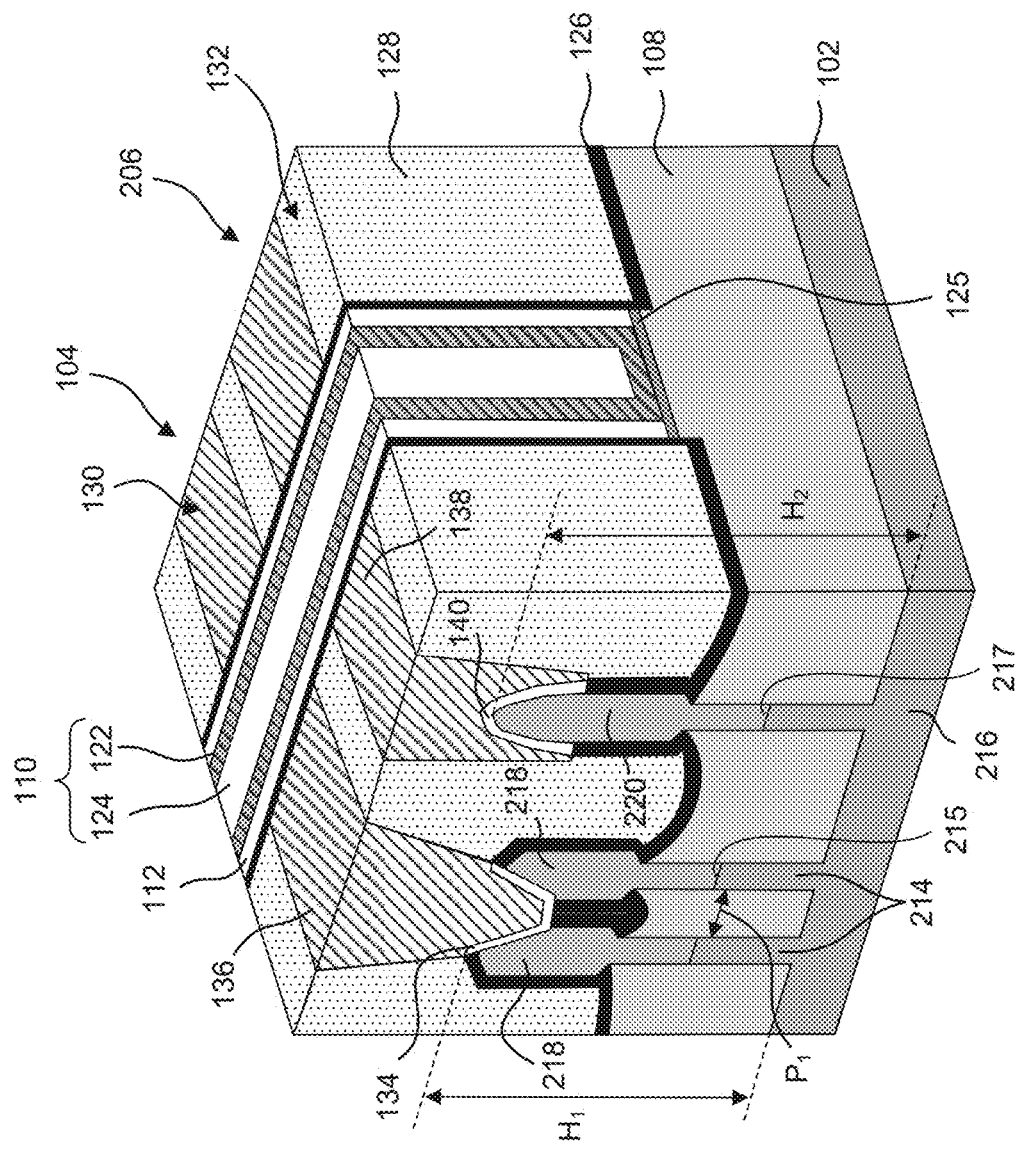

FIG. 2A is an isometric view of a device 200A, according to some embodiments. Elements in FIG. 2A with the same annotations as elements in FIG. 1A are described above. Device 200A may be included in a microprocessor, memory cell, or other integrated circuit. It will be recognized that the view of device 200A in FIG. 2A is shown for illustration purposes and may not be drawn to scale.

Device 200A may be formed on a substrate 102 and may include finFETs 204 and 206 as shown in FIG. 2A. Device 200A may further include shallow trench isolation (STI) regions 108, gate structure 110, spacers 112 disposed on opposite sides of gate structure 110, ESL 126, ILD layer 128, and contact structures 130 and 13. The above discussion of finFETs 104 and 106 applies to respective finFETs 204 and 206 unless mentioned otherwise.

FinFET 204 may include fin structures 214 and epitaxial source/drain (S/D) regions 218 and finFET 206 may include fin structure 216 and epitaxial S/D region 220. The above discussion of fin structures 114 and 116 applies to fin structures 214 and 216 and the discussion of epitaxial regions 118 and 120 applies to epitaxial S/D regions 218 and 220 unless mentioned otherwise. Fin structures 214 and 216 may traverse along a Y-axis and through gate structure 110.

In some embodiments, S/D regions 218 and 220 may be epitaxially formed from top surface of fin structures 214 and 216 after an etch back process performed on portions of fin structures 214 and 216 that are not underlying gate structure 110. S/D regions 218 and 220 may form respective interfaces 215 and 217 with fin structures 214 and 216. In some embodiments, interfaces 215 and 217 are on the same plane as top surface of STI regions 108. In some embodiments, interfaces 215 and 217 are either above or below the level of interface 109 formed between STI regions 108 and substrate 102.

Figure 2B:
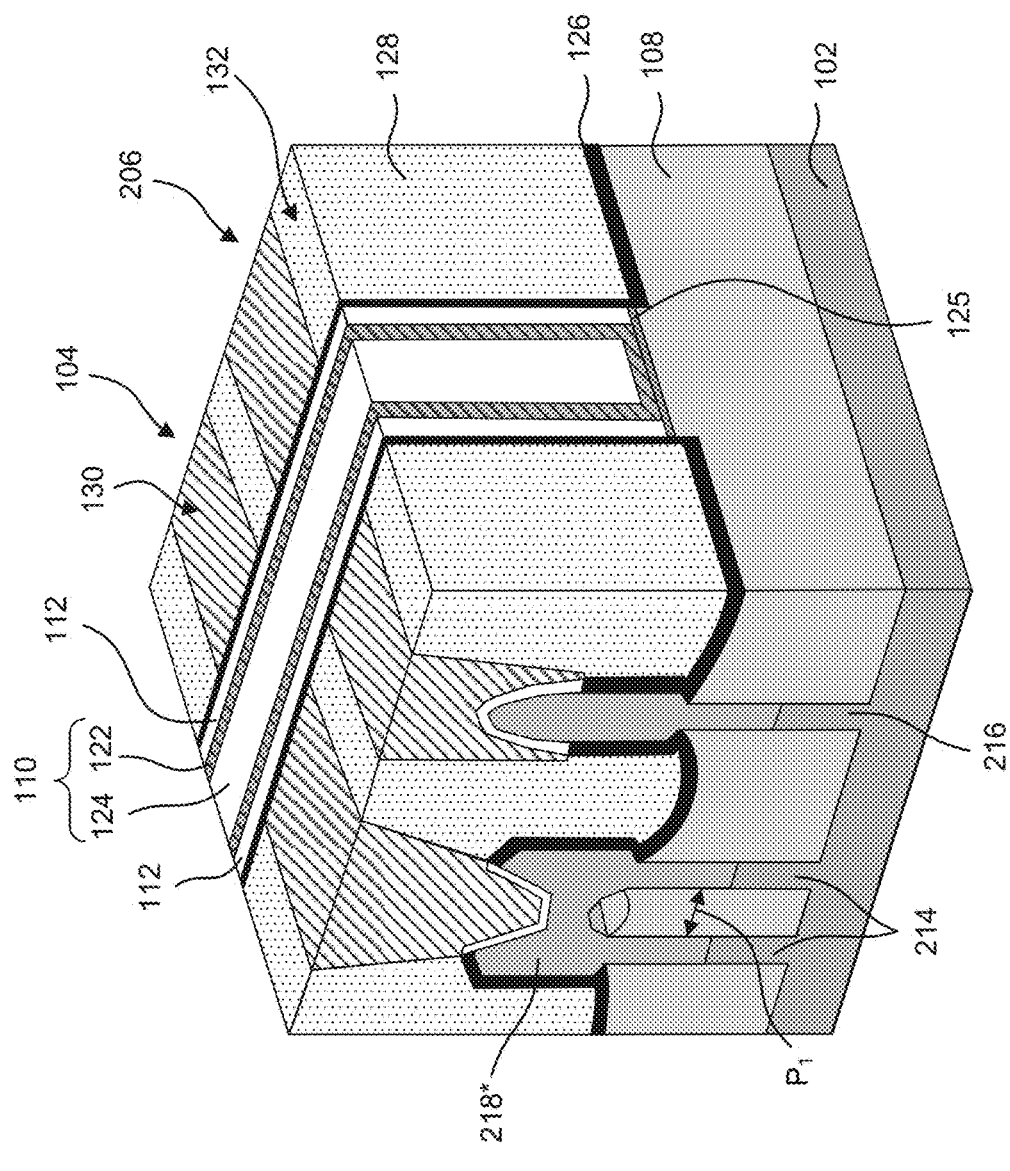

In some embodiments, epitaxial S/D regions 218 of finFET 204 may be unmerged as shown in FIG. 2A. Additionally or alternatively to fin structures 218, finFET 204 may have merged epitaxial S/D region 218* as shown in FIG. 2B. FIG. 2B is an isometric view of a device 200B, according to some embodiments. Elements in FIG. 2B with the same annotations as elements in FIGS. 1A and 2A are described above. The above discussion of epitaxial S/D regions 218 applies to epitaxial S/D region 218* unless mentioned otherwise.

FIGS. 1A-1B and 2A-2B show one gate structure 110. However, based on the disclosure herein, it will be recognized that devices 100A, 100B, 200A, and/or 200B may have additional gate structures similar and parallel to gate structure 110. In addition, device 100A, 100B, 200A, and/or 200B may be incorporated into an integrated circuit through the use of other structural components such as gate contact structures, conductive vias, conductive lines, dielectric layers, passivation layers, etc., that are omitted for the sake of clarity. Based on the disclosure herein, it will be recognized that cross-sectional shapes of STI regions 108, spacers 112, fin structures 114, 116, 214, and 216, and epitaxial regions 118, 120, 218, 220, and 218* are illustrative and are not intended to be limiting.

Figure 3:
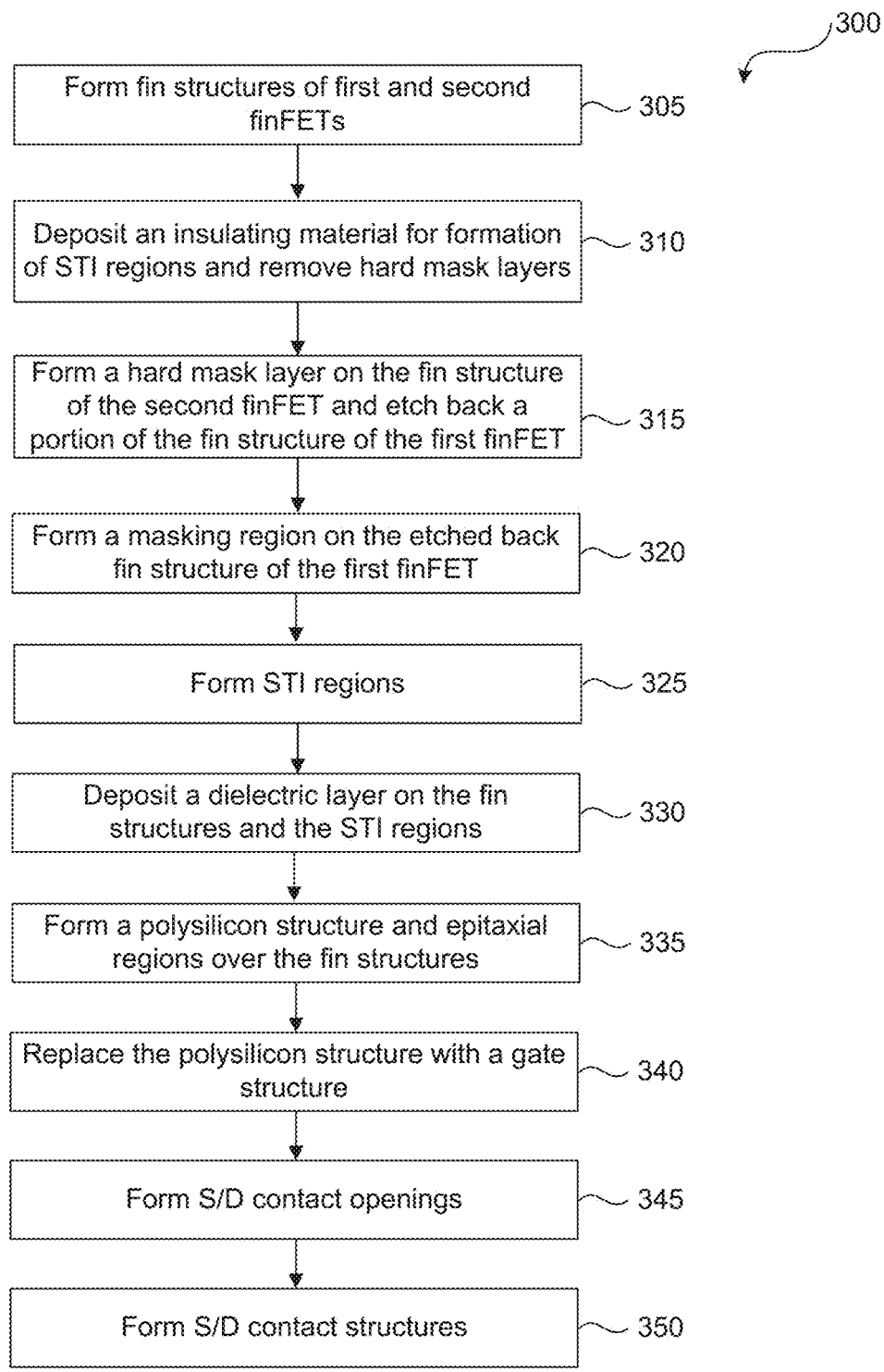
FIG. 3 is flow diagram of a method for fabricating a finFET, in accordance with some embodiments.

FIG. 3 is a flow diagram of an example method 300 for fabricating devices 100A and/or 100B, according to some embodiments. For illustrative purposes, the operations illustrated in FIG. 3 will be described with reference to the example fabrication process for fabricating devices 100A and 100B as illustrated in FIGS. 4A-13A and FIGS. 4B-13B, respectively. FIGS. 4A-13A and 4A-13B are isometric views of respective devices 100A and 100B at various stages of their fabrication, according to some embodiments. Operations can be performed in a different order or not performed depending on specific applications. It should be noted that method 300 does not produce complete devices 100A and 100B. Accordingly, it is understood that additional processes may be provided before, during, and after method 300, and that some other processes may only be briefly described herein. Elements in FIGS. 4A-13A and 4B-13B with the same annotations as elements in FIGS. 1A-1B and 2A-2B are described above.

Figure 4A:
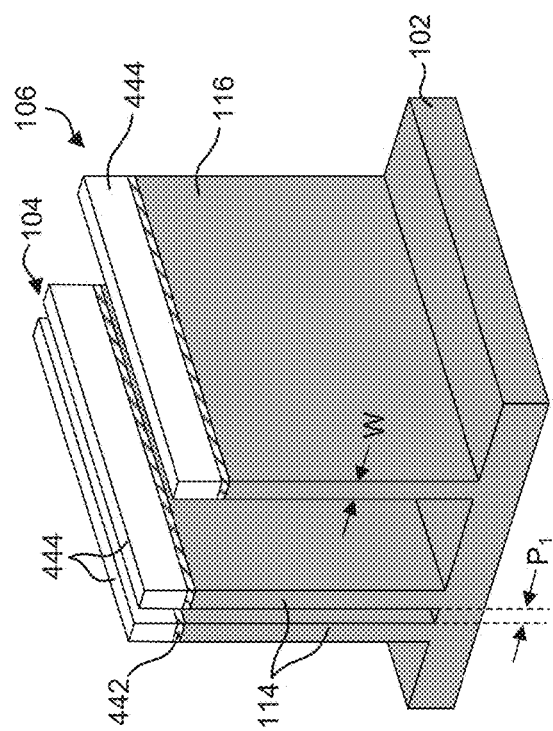
Figure 4B:
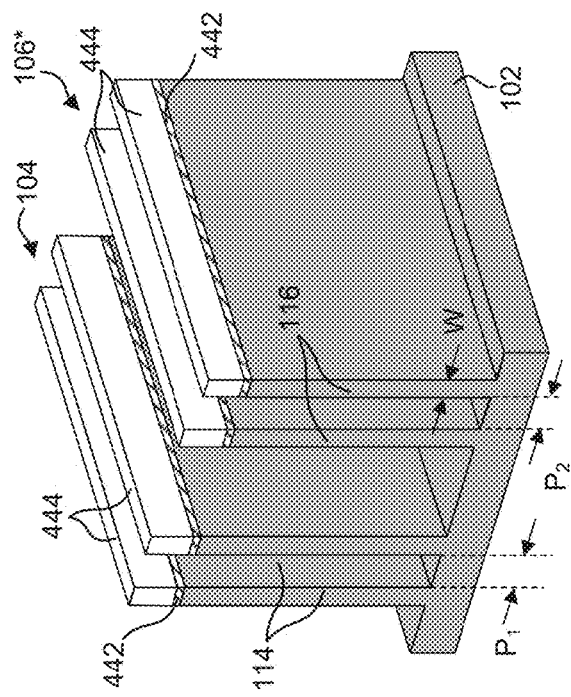

In operation 305, fin structures of first and second finFETs are formed on a substrate. For example, as shown in FIGS. 4A and 4B, fin structures 114 of finFET 104 and fin structures 116 of finFETs 106 and 106* are formed on substrate 102. Fin structures 114 and 116 may be formed by etching substrate 102 through patterned hard mask layers 442 and 444 formed on unetched substrate 102. In some embodiments, hard mask layer 442 may be a thin film including silicon oxide formed, for example, using a thermal oxidation process. In some embodiments, hard mask layer 444 may be formed of silicon nitride using, for example, low pressure chemical vapor deposition (LPCVD) or plasma enhanced CVD (PECVD). In some embodiments, fin structures 114 and 116 each may have fin widths W less than about 30 nm.

Figure 5A:
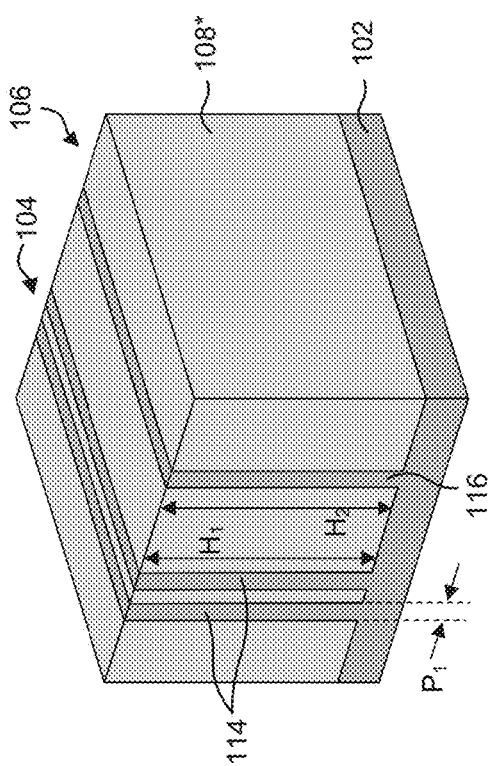
Figure 5B:
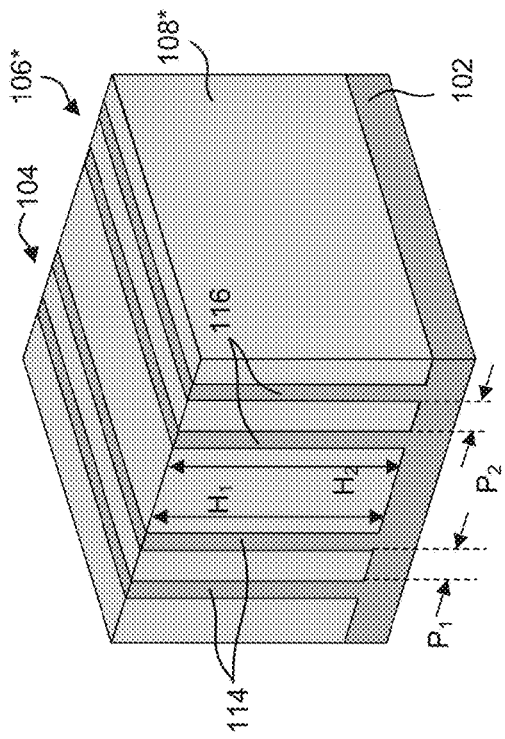
Figure 6A:
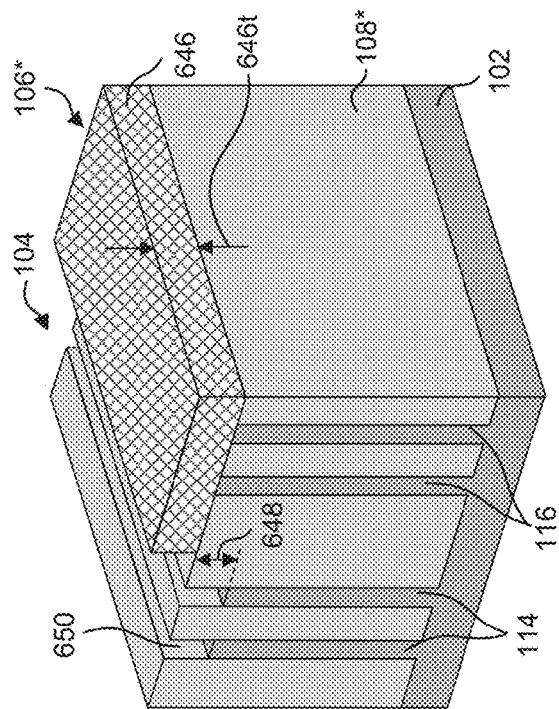
Figure 7A:
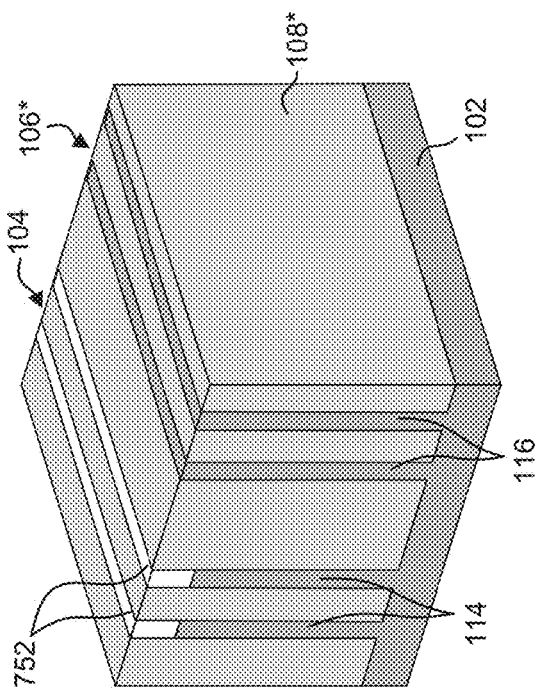
Figure 6B:
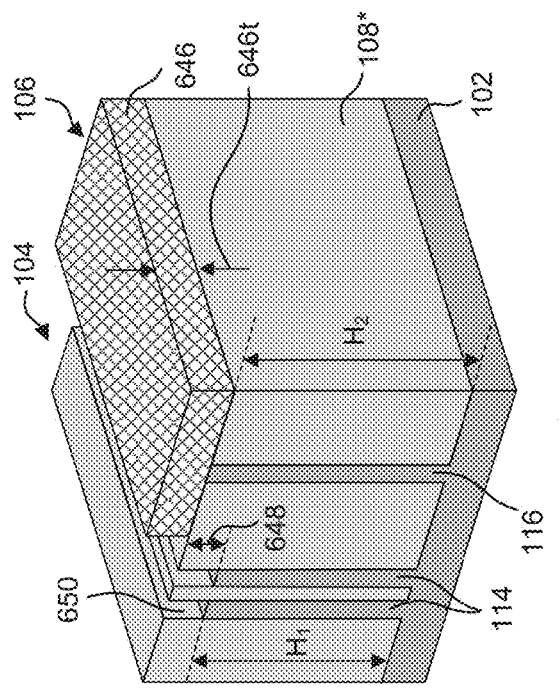
Figure 7B:
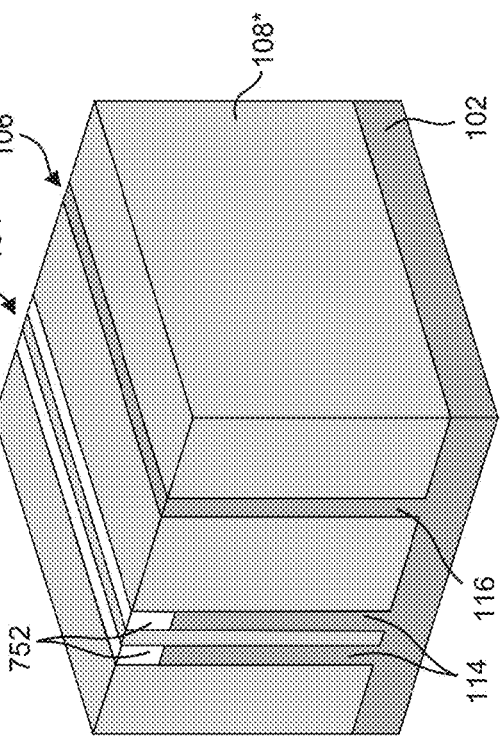

In referring to FIG. 3, in operation 310, a layer of insulating material for STI regions is deposited and the patterned hard mask layers are removed. For example, a layer of insulating material 108* may be blanket deposited on the structures of FIGS. 4A and 4B followed by a chemical mechanical polishing (CMP) process to form the structures of FIGS. 5A and 5B. The CMP process may remove the patterned hard mask layers 442 and 444 and portions of layer of insulating material 108* to substantially coplanarize a top surface of layer of insulating material 108* with top surfaces of fin structures 114 and 116 as shown in FIGS. 5A and 5B.

In some embodiments, layer of insulating material 108* may include, for example, silicon oxide, silicon nitride, silicon oxynitride, fluoride-doped silicate glass (FSG), or a low-k dielectric material. In some embodiments, layer of insulating material 108* may be deposited using a flowable chemical vapor deposition (FCVD) process, a high-density-plasma (HDP) CVD process, using silane ($SiH_4$) and oxygen ($O_2$) as reacting precursors. In some embodiments, layer of insulating material 108* may be formed using a sub-atmospheric CVD (SACVD) process or high aspect-ratio process (HARP), where process gases may include tetraethoxysilane (TEOS) and/or ozone ($O_3$). In some embodiments, layer of insulating material 108* may be formed using a spin-on-dielectric (SOD) such as, for example, hydrogen silsesquioxane (HSQ) or methyl silsesquioxane (MSQ).

In referring to FIG. 3, in operation 315, a hard mask layer is formed on the fin structure of the second finFET and a portion of the fin structure of the first finFET is etched back. For example, a layer of insulating material may be blanket deposited on the structures of FIGS. 5A and 5B and then patterned using photolithography and a dry etching process (e.g., reaction ion etching process) to form thin hard mask layer 646 on finFETs 106 and 106* as shown in respective FIGS. 6A and 6B. Thin hard mask layer 646 may include, for example, silicon oxide, silicon nitride, silicon oxynitride, or a low-k dielectric material. In some embodiments, thin hard mask layer 646 may be deposited using CVD, ALD, HDP CVD process, or a suitable process for depositing a thin layer of insulating material. In some embodiments, thin hard mask layer 646 may have a thickness ranging from about 2 nm to about 8 nm (e.g., about 3 nm, about 5 nm, or about 7 nm). Based on the disclosure herein, it will be recognized that other thicknesses and materials for thin hard mask layer 646 are within the scope and spirit of this disclosure.

The formation of thin hard mask layer 646 may be followed by an etch back process of fin structures 114 of finFET 104 to form recessed regions 650 within layer of insulating material 108*. The fin structures 114 may be etched back by a vertical dimension 648 from a top surface of layer of insulating material 108*. In some embodiments, vertical dimension 648 may range from about 20 nm to about 50 nm. The etch back process may include a dry etching process (e.g., reaction ion etching process using a chlorine based etchant). Thin hard mask layer 646 may prevent fin structures 116 from being etched back during the etch back process of fin structures 114, and consequently, facilitate the formation of fin structures of different heights, such as, for example, height $H_1$ of fin structures 114 ranging from about 20 nm to about 40 nm and height $H_2$ of fin structures 116 ranging from about 50 nm to about 60 nm. In some embodiments, during the etch back process of fin structures 114, the thickness of thin hard mask layer 646 may be reduced to a thickness 646t ranging from about 1 nm to about 3 nm.

In referring to FIG. 3, in operation 320, a masking region is formed on the etched back fin structure of the first finFET. For example, a layer of insulating material may be blanket deposited on the structures of FIGS. 6A and 6B followed by a CMP process to form masking regions 752 as shown in respective FIGS. 7A and 7B. The CMP process may be performed until top surfaces of masking regions 752, layer of insulating material 108*, and fin structures 116 are substantially coplanar. In some embodiments, top surfaces of layer of insulating material 108* and fin structures 116 may act as CMP stop layer. In some embodiments, dry and/or wet etch processes may be used instead of or in combination with the CMP process to form masking regions 752. Masking regions 752 may include, for example, silicon oxide, silicon nitride, silicon oxynitride, a low-k dielectric material, or a suitable insulating material. In some embodiments, the layer of insulating material for forming masking regions 752 may be deposited using CVD, ALD, HDP CVD process, or a suitable process for depositing a layer of insulating material. Based on the disclosure herein, it will be recognized that other materials for masking regions 752 are within the scope and spirit of this disclosure.

In referring to FIG. 3, in operation 325, STI regions are formed. For example, as shown in FIGS. 8A and 8B, STI regions 108 are formed. STI regions 108 may be formed by etching back layer of insulating material 108* of the structures shown in FIGS. 7A and 7B. In some embodiments, masking regions 752 may be etched during the etch back of layer of insulating material 108*. The etchants used to etch back layer of insulating material 108* may have similar etch selectivity to masking regions 752 and layer of insulating material 108*.

The etch back of layer of insulating material 108* may be performed, for example, by a dry etch process, a wet etch process, or a combination thereof. In some embodiments, the dry etch process may include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process may include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process may include using an etch process that may use ammonia ($NH_3$) and hydrofluoric acid (HF) as etchants and inert gases such as, for example, Ar, xenon (Xe), He, or a combination thereof. In some embodiments, the flow rate of HF and $NH_3$ used in the etch process may each range from about 10 sccm to about 100 sccm (e.g., about 20 sccm, 30 sccm, or 40 sccm). In some embodiments, the etch process may be performed at a pressure ranging from about 5 mTorr to about 100 mTorr (e.g., about 20 mTorr, about 30 mTorr, or about 40 mTorr) and a high temperature ranging from about 50° C. to about 120° C.

In referring to FIG. 3, in operation 330, a dielectric layer is deposited. For example, as shown in FIGS. 9A and 9B, a dielectric layer 125* may be blanket deposited on the structures of FIGS. 8A and 8B. Dielectric layer 125* may form dielectric layer 125 (shown in FIGS. 1A-1B and 2A-2B) in subsequent processing. Dielectric layer 125* may include a suitable dielectric material, such as, for example, silicon oxide and may be deposited using a suitable dielectric material deposition process, such as, for example, CVD or ALD.

Figure 10A:
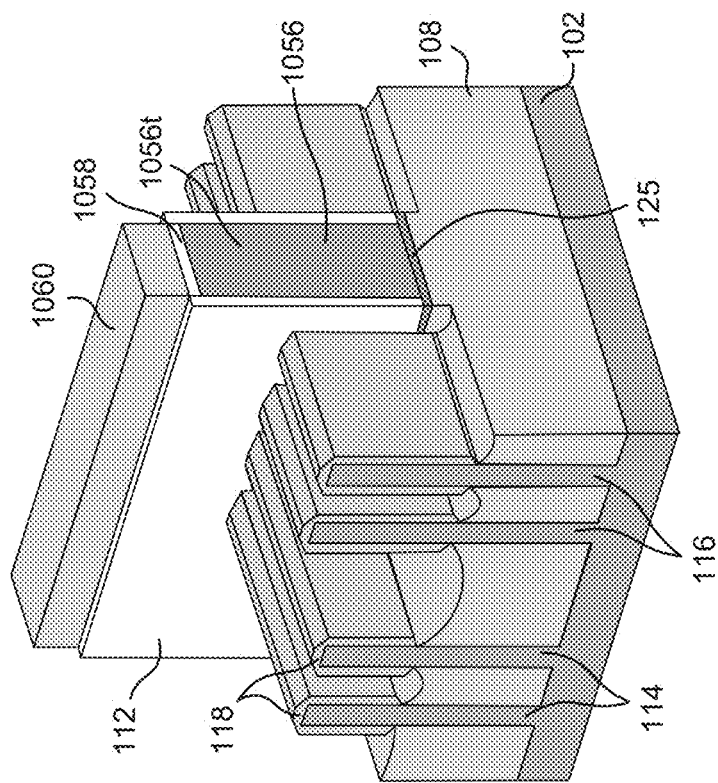
Figure 10B:
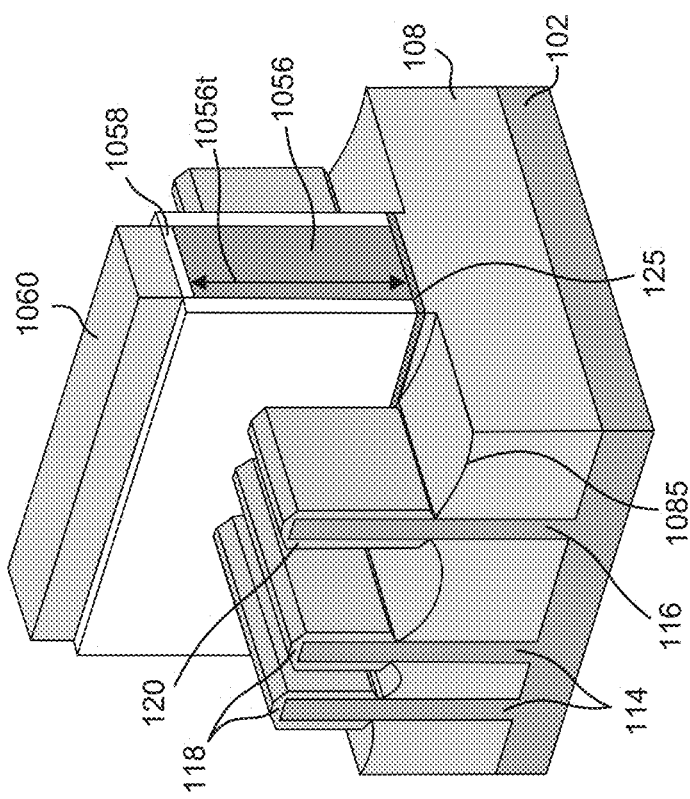

In referring to FIG. 3, in operation 335, a polysilicon structure and epitaxial regions are formed on the fin structures of the first and second finFET. For example, polysilicon structure 1056 and epitaxial regions 118 and 120 may be formed as shown in FIGS. 10A and 10B. Polysilicon structure 1056 may be formed on the structures of FIGS. 9A and 9B. In some embodiments, a vertical dimension 1056t of polysilicon structure 1056 may be in a range from about 90 nm to about 200 nm. In some embodiments, polysilicon structure 760 and hard mask layers 1058 and 1060 may be replaced in a gate replacement process during subsequent processing to form gate structure 110 discussed above.

In some embodiments, polysilicon structure 1056 may be formed by blanket deposition of polysilicon, followed by photolithography and etching of the deposited polysilicon. The deposition process may include chemical vapor deposition (CVD), physical vapor deposition (PVD), atomic layer deposition (ALD), other suitable deposition methods, or a combination thereof. Photolithography may include photoresist coating (e.g., spin-on coating), soft baking, mask aligning, exposure, post-exposure baking, developing the photoresist, rinsing, drying (e.g., hard baking), other suitable processes, or a combination thereof. Etching processes may include dry etching, wet etching, and/or other etching methods (e.g., reactive ion etching).

In some embodiments, hard mask layers 1058 and 1060 may be patterned on polysilicon structure 1056 to protect polysilicon structure 1056 from subsequent processing steps. Hard mask layers 1058 and 1060 may include insulating material such as, for example, silicon nitride.

The formation of hard mask layers 1058 and 1060 may be followed by formation of spacers 112 on sidewalls of polysilicon structure 1056. Spacers 112 may be selectively formed on sidewalls of polysilicon structure 1056 and may not be formed on dielectric layer 125* of FIGS. 9A and 9B. The selective formation of spacers 112 may include a surface treatment and a deposition process. The surface treatment may include exposing dielectric layer 125* and polysilicon structure 1056 to an inhibitor to form an inhibiting layer (not shown) on top surface of dielectric layer 125* and to form a H- or F-terminated surfaces on the sidewalls of polysilicon structure 1056. The inhibiting layer may have a hydroxyl-terminated surface. The H- or F-terminated surfaces may facilitate the deposition of the material of spacers 112. The surface treatment may further include selectively converting the hydroxyl-terminated surface to a hydrophobic surface by including a hydrophobic component (e.g., a component having carbon) to the hydroxyl-terminated surface. In some embodiments, an etching process performed at about 45° C. can be used to remove native oxide from the hydroxyl-terminated surface to convert the hydroxyl-terminated surface to a hydrophobic surface. In some embodiments, the etching process is performed using process gases such as, for example, nitrogen trifluoride, ammonia, hydrogen fluoride, other suitable gas, and/or combinations thereof. In some embodiments, the etching process is performed using a combined gas of nitrogen trifluoride and hydrogen. In some embodiments, the etching process is performed using a combined gas of hydrogen fluoride and ammonia. The hydrophobic surface may prevent deposition of the material of spacers 112 on dielectric layer 125*. The surface treatment may be followed by the deposition of the material of spacer 112.

In some embodiments, the material of spacers 112 may be deposited using, for example, CVD or ALD. The surface treatment may be performed before or during the deposition process. The deposition process may be followed by, for example, an oxygen plasma treatment to remove the hydrophobic component and the inhibitor layer on the top surface of dielectric layer 125*. In some embodiments, spacer 112 may include (i) a dielectric material such as, for example, silicon oxide, silicon carbide, silicon nitride, silicon oxynitride, (ii) an oxide material, (iii) an nitride material, (iv) a low-k material, or (v) a combination thereof. In some embodiments, dielectric layer 125* may include silicon oxide and spacers 112 may include silicon nitride.

The selective formation of spacers 112 may followed by formation of dielectric layer 125 (shown in FIGS. 10A and 10B) by etching of dielectric layer 125* from regions that are not covered by polysilicon structure 1056 and spacers 112. The etch process may include a wet etch process using, for example, diluted HF. This etch process may etch native oxide from top surfaces of fin structures 114 and 116. In some embodiments, this etch process may etch some portions of STI regions 108 and consequently, form curved top surfaces 108s of STI regions 108.

The etching of dielectric layer 125* may be followed by the growth of epitaxial regions 118 and 120 on respective fin structures 114 and 116. In some embodiments, epitaxial regions 118 and 120 may be grown by (i) chemical vapor deposition (CVD) such as, for example, by low pressure CVD (LPCVD), atomic layer CVD (ALCVD), ultrahigh vacuum CVD (UHVCVD), reduced pressure CVD (RP-CVD), or any suitable CVD; (ii) molecular beam epitaxy (MBE) processes; (iii) any suitable epitaxial process; or (iv) a combination thereof. In some embodiments, epitaxial regions 118 and 120 may be grown by an epitaxial deposition/partial etch process, which repeats the epitaxial deposition/partial etch process at least once. Such repeated deposition/partial etch process is also called a "cyclic deposition-etch (CDE) process." In some embodiments, epitaxial regions 118 and 120 may be grown by selective epitaxial growth (SEG), where an etching gas is added to promote the selective growth of semiconductor material on the exposed surfaces of fin structures 114 and 116, but not on insulating material (e.g., dielectric material of STI regions 108).

In some embodiments, both epitaxial regions 118 and 120 may be p-type or n-type. In some embodiments, epitaxial regions 118 and 120 may be of opposite doping type with respect to each other. In some embodiments, p-type epitaxial regions 118 and 120 may include SiGe and may be in-situ doped during an epitaxial growth process using p-type dopants such as, for example, boron, indium, or gallium. For p-type in-situ doping, p-type doping precursors such as, but not limited to, diborane (B2H6), boron trifluoride (BF3), and/or other p-type doping precursors can be used. In some embodiments, n-type epitaxial regions 118 and 120 may include Si and may be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used.

In some embodiments, instead of the growth of epitaxial regions 118 and 120, the etching of dielectric layer 125* may be followed by etch back of fin structures 114 and 116 to form fin structures 214 and 216 as discussed above with reference to FIGS. 2A and 2B. The formation of fin structures 214 and 216 may be followed by the epitaxial growth of S/D regions 218, 220, and 218* as discussed above.

Figure 11A:
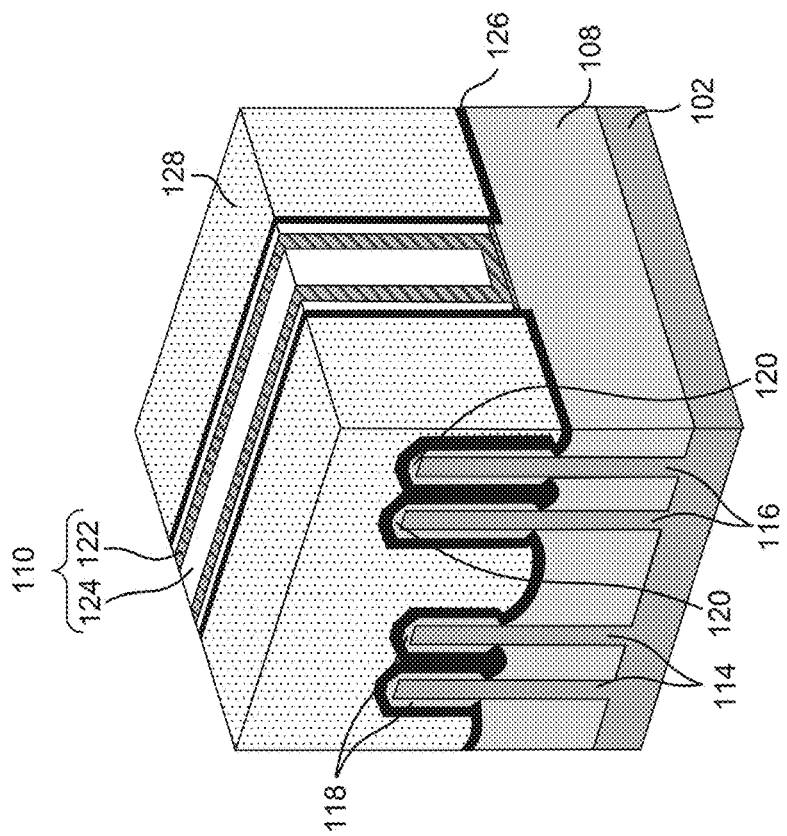
Figure 11B:
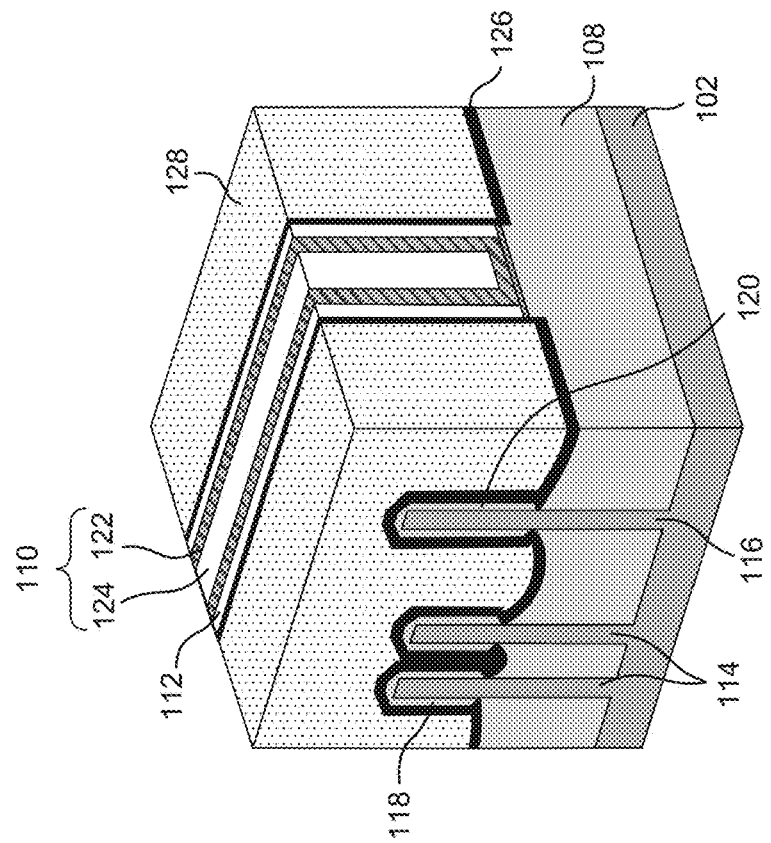

In referring to FIG. 3, in operation 340, the polysilicon structure is replaced with a gate structure. For example, as shown in FIGS. 11A and 11B gate structure 110 may be formed after removing polysilicon structure 1056. In some embodiments, prior to the removal of polysilicon structure 1056, ESL 126 and ILD layer 128 may be formed as shown in FIGS. 11A and 11B. In some embodiments, ESL 126 may include, for example, SiNx, SiON, SiC, SiCN, BN, SiBN, SiCBN, or a combination thereof. In some embodiments, ESL 126 may include silicon nitride formed by low pressure chemical vapor deposition (LPCVD), plasma enhanced chemical vapor deposition (PECVD), chemical vapor deposition (CVD), or atomic layer deposition (ALD). In some embodiments, ILD layer 128 may include a dielectric material. The dielectric material of ILD layer 128 may be deposited using a deposition method suitable for flowable dielectric materials (e.g., flowable silicon oxide). For example, flowable silicon oxide may be deposited for ILD layer 128 using flowable CVD (FCVD).

The removal of polysilicon structure 1056 and hard mask layers 1058 and 1060 may be performed using a dry etching process (e.g., reaction ion etching) or a wet etching process. In some embodiments, the gas etchants used in etching of polysilicon structure 1056 and hard mask layers 1058 and 1060 may include chlorine, fluorine, or bromine. In some embodiments, an $NH_4OH$ wet etch may be used to remove polysilicon structure 1056, or a dry etch followed by a wet etch process may be used to remove polysilicon structure 1056.

The formation of gate structure 110 may include deposition of dielectric layer 122. Dielectric layer 122 may include silicon oxide and may be formed by CVD, atomic layer deposition (ALD), physical vapor deposition (PVD), e-beam evaporation, or other suitable process. In some embodiments, dielectric layer 122 may include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers may be formed by ALD and/or other suitable methods. In some embodiments, dielectric layer 122 may include a single layer or a stack of insulating material layers.

The deposition of dielectric layer 122 may be followed by deposition of gate electrode 124. Gate electrode 124 may include a single metal layer or a stack of metal layers. The stack of metal layers may include metals different from each other. In some embodiments, gate electrode 124 may include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate electrode 124 may be formed by ALD, PVD, CVD, or other suitable deposition process.

The deposited dielectric layer 122 and gate electrode 124 may be planarized by a CMP process. The CMP process may coplanarize top surfaces of dielectric layer 122 and gate electrode 124 with top surface ILD layer 128 as shown in FIGS. 11A and 11B.

Figure 12A:
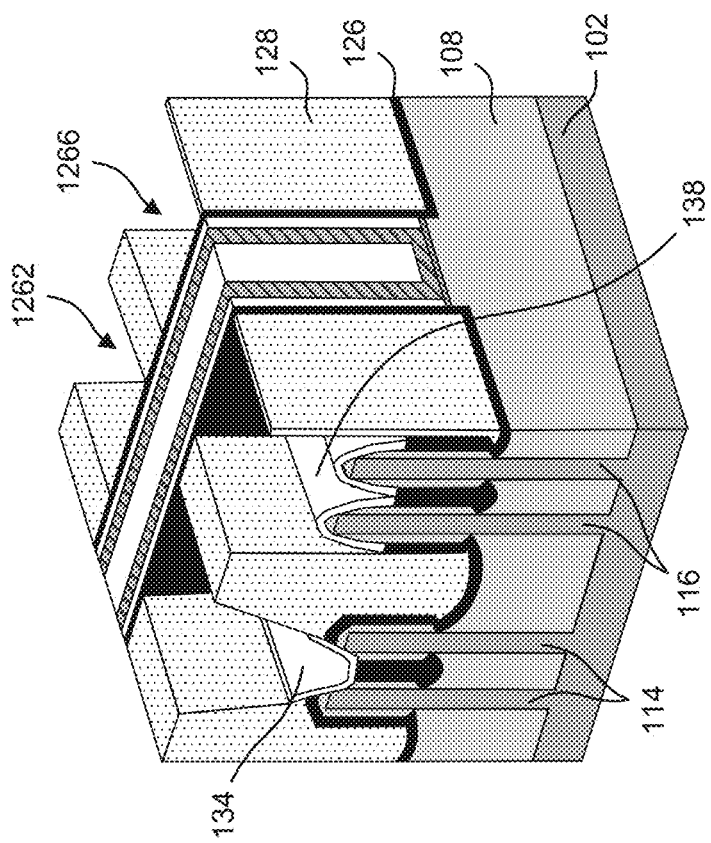
Figure 12B:
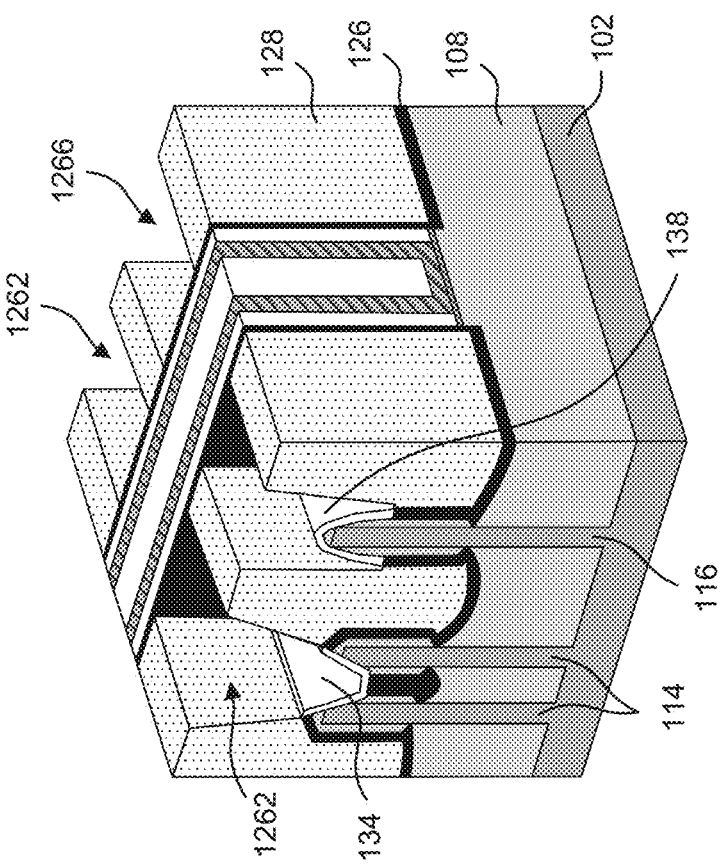

In referring to FIG. 3, in operation 345, S/D contact openings are formed on the epitaxial regions. For example, as shown in FIGS. 12A and 12B, S/D contact openings 1262 and 1264 may be formed on respective epitaxial regions 114 and 116. The formation of S/D contact openings 1262 and 1264 may include (i) removing portions of ILD layer 128 overlying epitaxial regions 118 and 120 and (ii) removing portions of ESL 126 underlying the etched portions of ILD layer 128. The removal of the portions of ILD layer 128 may include patterning using photolithography to expose areas on top surface of ILD layer 128 corresponding to the portions of ILD layer 128 that are to be removed. The portions of ILD layer 128 may be removed by a dry etching process. In some embodiments, the dry etching process may be a fluorine-based process.

The ILD etch process may include two steps. In the first etch step, etching may be performed using $CF_4$ gas at a flow rate ranging from about 50 sccm to about 500 sccm. In the second etch step, etching may be performed using a gas mixture including $C_4F_6$ gas at a flow rate ranging from about 5 sccm to about 50 sccm, Ar gas at a flow rate ranging from about 100 sccm to about 500 sccm, and $O_2$ gas at a flow rate ranging from about 5 sccm to about 50 sccm. In some embodiments, each of the first and second etch steps may be carried out for a time period ranging from about 1 sec to about 60 sec. In some embodiments, each of the first and second etch steps may be performed at a temperature ranging from about 10° C. to about 100° C., under a pressure ranging from about 3 mTorr to about 500 mTorr, and at an RF power ranging from about 300 W to about 800 W. In some embodiments, the first etch step has a higher etch rate than the second etch step.

The etching of the portions of ILD layer 128 may be followed by a dry etching of portions of ESL 126 underlying the etched portions of ILD layer 128. In some embodiments, these portions of ESL 126 may be etched in two steps. In the first etch step, etching may be performed using a gas mixture including difluoromethane ($CH_2F_2$) gas at a flow rate ranging from about 5 sccm to about 50 sccm and carbon tetrafluoride ($CF_4$) gas at a flow rate ranging from about 10 sccm to about 100 sccm. In the second etch step, etching may be performed using a gas mixture including fluoromethane ($CH_3F$) gas at a flow rate ranging from about 5 sccm to about 50 sccm, Ar gas at a flow rate ranging from about 100 sccm to about 500 sccm, and $H_2$ gas at a flow rate ranging from about 100 sccm to about 500 sccm. In some embodiments, each of the first and second etch steps may be carried out for a time period ranging from about 1 sec to about 60 sec. In some embodiments, each of the first and second etch steps may be performed at a temperature ranging from about 10° C. to about 100° C., under a pressure ranging from about 10 mTorr to about 100 mTorr, and at an RF power ranging from about 500 W to about 800 W. In some embodiments, the first etch step has a higher etch rate than the second etch step.

In some embodiments, the formation of S/D contact openings 1262 and 1264 may be followed by formation of metal silicide layers 134 and 138 as shown in FIGS. 12A and 12B. In some embodiments, the metal used for forming metal silicides may include Co, Ti, or Ni. In some embodiments, TiN, Ti, Ni, Co, or a combination thereof is deposited by ALD or CVD to form diffusion barrier layers (not shown) along surfaces of S/D contact openings 1262 and 1264. This deposition of diffusion barrier layers is followed by a rapid thermal annealing process at a temperature in a range from about 700° C. to about 900° C. to form metal silicide layers 134 and 138.

Figure 13B:
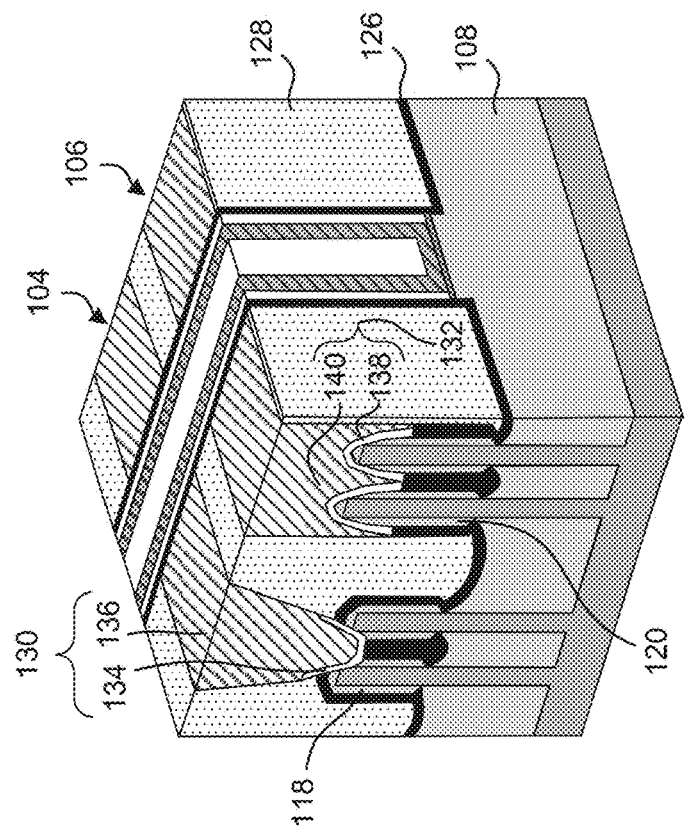
Figure 13A:
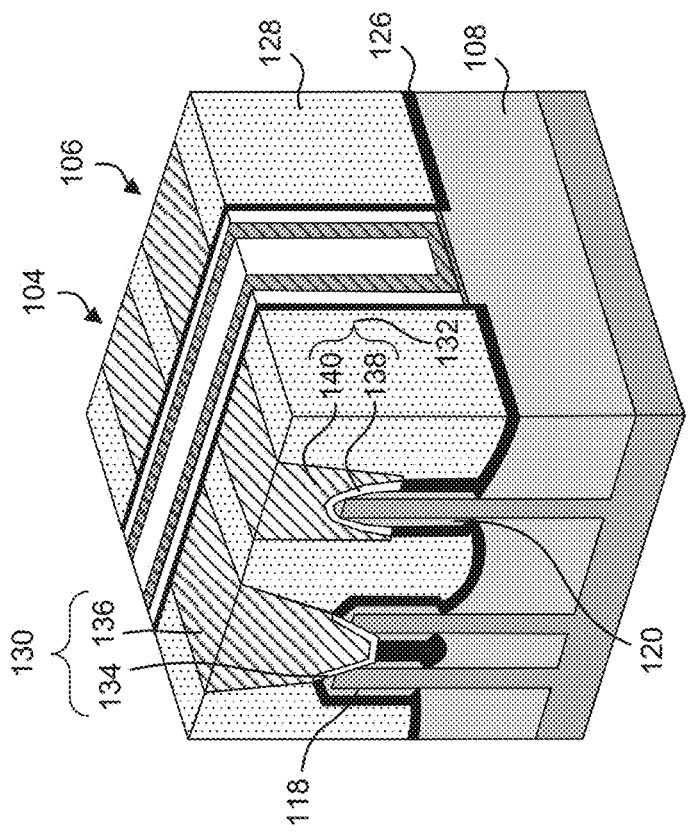

In referring to FIG. 3, in operation 350, S/D contact structures are formed in the S/D contact openings. For example, as shown in FIGS. 13A and 13B, S/D contact structures 130, 132, and 132* may be formed in contact openings 1262 and 1264. The formation of conductive regions 136 and 140 of respective contact structures 130 and 132 may include deposition of materials of conductive regions 136 and 140. Blanket deposition of the materials of conductive 136 and 140 may be performed using, for example, PVD, CVD, or ALD, on the structures of FIGS. 12A and 12B. In some embodiments, conductive regions 136 and 140 may include a conductive material such as, for example, W, Al, Co, Cu, or a suitable conductive material.

The deposition of the materials of conductive regions 136 and 140 may be followed by a CMP process to coplanarize top surfaces of conductive regions 136 and 140 with top surface of ILD layer 128. In some embodiments, the CMP process, may use a silicon or an aluminum abrasive with abrasive concentrations ranging from about 0.1% to about 3%. In some embodiments, the silicon or aluminum abrasive may have a pH level less than 7 for W metal in conductive regions 136 and 140 or may have a pH level greater than 7 for cobalt (Co) or copper (Cu) metals in conductive regions 136 and 140.

The above embodiments describe structures and methods for simultaneously fabricating semiconductor devices having different fin structures on a same substrate. Such embodiments provide methods of fabricating finFETs, having different fin heights and fin-to-fin pitch with respect to each other, using shared processing steps to simultaneously form one or more components (e.g., STI regions, polysilicon structure, gate structure) of the finFETs. The simultaneous fabrication of finFETs having different configurations of fin structures on the same substrate helps to achieve simpler and more cost-effective fabrication process than the other methods used to fabricate fin structures of different configurations.

In some embodiments, a method of forming first and second finFETs on a substrate includes forming first and second fin structures of the first and second finFETs, respectively, on the substrate. The first and second fin structures have respective first and second vertical dimensions that are about equal to each other. The method further includes modifying the first fin structure such that the first vertical dimension of the first fin structure is smaller than the second vertical dimension of the second fin structure and depositing a dielectric layer on the modified first fin structure and the second fin structure. The method further includes forming a polysilicon structure on the dielectric layer and selectively forming a spacer on a sidewall of the polysilicon structure.

In some embodiments, a method of forming first and second finFETs on a substrate includes forming first and second pair of fin structures of the first and second finFETs, respectively, on the substrate, where a fin-to-fin pitch of the first pair of fin structures is smaller than a fin-to-fin pitch of the second pair of fin structures. The method further includes modifying the first pair of fin structures such that a first vertical dimension of the first pair of fin structures is smaller than a second vertical dimension of the second pair of fin structures and forming a polysilicon structure over the modified first pair of fin structures and the second pair of fin structures. The method further includes selectively forming a spacer on a sidewall of the polysilicon structure and forming a dielectric layer under the polysilicon structure and the spacer.

In some embodiments, a semiconductor device includes first and second finFETs on a substrate. The first finFET includes a first fin structure having a first vertical dimension and a first epitaxial region on the first fin structure. The second finFET includes a second fin structure having a second vertical dimension that is greater than the first vertical dimension and a second epitaxial region on the second fin structure. The semiconductor device further includes a gate structure over the first and second fin structures, a spacer on the sidewalls of the gate structure, and a dielectric layer under the gate structure and the spacer.

In some embodiments, a method of forming first and second finFETs on a substrate includes forming first and second fin structures of the first and second finFETs, respectively, on the substrate. The first and second fin structures have respective first and second vertical dimensions that are equal to each other. The method further includes modifying the first fin structure such that the first vertical dimension of the first fin structure is smaller than the second vertical dimension of the second fin structure and forming a polysilicon structure over the modified first fin structure and the second fin structure. The method further includes selectively forming a spacer on a sidewall of the polysilicon structure, recessing the modified first fin structure and the second fin structure, and forming epitaxial source/drain regions on the recessed modified first fin structure and the recessed second fin structure.

In some embodiments, a method of forming first and second finFETs on a substrate includes forming first and second pair of fin structures of the first and second finFETs, respectively, on the substrate, where a fin-to-fin pitch of the first pair of fin structures is smaller than a fin-to-fin pitch of the second pair of fin structures. The method further includes modifying the first pair of fin structures such that a first vertical dimension of the first pair of fin structures is smaller than a second vertical dimension of the second pair of fin structures, recessing the modified first fin structure and the second fin structure, and forming a merged epitaxial source/drain region on the recessed modified first fin structure and an epitaxial source/drain region on the recessed second fin structure.

In some embodiments, a semiconductor device includes first and second finFETs on a substrate. The first finFET includes a pair of fin structures having a first vertical dimension and a merged source/drain epitaxial region on the pair of fin structures. The second finFET a second vertical dimension that is greater than the first vertical dimension and a source/drain epitaxial region on the second fin structure. The semiconductor device further includes a gate structure over the first and second fin structures, a spacer on the sidewalls of the gate structure, and a dielectric layer under the gate structure and the spacer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming first and second fin field effect transistors (finFETs) on a substrate, the method comprising:
    forming first and second fin structures of the first and second finFETs, respectively, on the substrate, wherein the first and second fin structures comprise semiconductive material and have respective first and second vertical dimensions that are about equal to each other;

depositing and planarizing a layer of insulating material on the substrate, wherein a top surface of the layer of insulating material is coplanar with top surfaces of the first and second fin structures;

depositing a hard mask layer on the top surfaces of the layer of insulating material and the second fin structure;

modifying the first fin structure such that a modified first vertical dimension of the first fin structure is smaller than the second vertical dimension of the second fin structure;

depositing a dielectric layer on the modified first fin structure and the second fin structure;

forming a polysilicon structure on the dielectric layer; and selectively forming a spacer on a sidewall of the polysilicon structure.

2. The method of claim 1, wherein the modifying the first fin structure comprises:

patterning the deposited hard mask layer to expose the top surface of the first fin structure; and etching a portion of the first fin structure.

3. The method of claim 1, wherein the modifying the first fin structure comprises:

patterning the deposited hard mask layer to expose the top surface of the first fin structure and to mask the top surface of the second fin structure;

etching a portion of the first fin structure such that a top surface of the modified first fin structure is below the top surface of the second fin structure; and removing the patterned deposited hard mask layer.

4. The method of claim 1, further comprising forming a shallow trench isolation (STI) region, wherein the forming the STI region comprises:

forming an insulating region on the modified first fin structure such that a top surface of the insulating region, the top surface of the second fin structure, and the top surface of the layer of insulating material are substantially coplanar with each other; and etching the layer of insulating material such that a top surface of the etched layer of insulating material is below the top surfaces of the modified first fin structure and the second fin structure.

5. The method of claim 1, wherein a difference between the modified first vertical dimension and the second vertical dimension ranges from about 20 nm to about 50 nm.

6. The method of claim 1, wherein the selectively forming the spacer on the sidewall of the polysilicon structure comprises performing a surface treatment on the dielectric layer and the sidewall of the polysilicon structure.

7. The method of claim 1, Wherein the selectively forming the spacer on the sidewall of the polysilicon structure comprises:

forming an inhibiting layer on the dielectric layer;

incorporating a hydrophobic component into the inhibiting layer;

depositing a spacer material on the sidewall of the polysilicon structure; and removing the inhibiting layer and the hydrophobic component.

8. The method of claim 1, further comprising:

etching portions of the dielectric layer On the modified first fin structure and the second fin structure; and forming first and second epitaxial regions respectively on the modified first fin structure and on the second fin structure.

9. The method of claim 8, further comprising etching a portion of the first epitaxial region and at least a portion of the modified first fin structure.

10. The method of claim 1, further comprising depositing a masking material on a top surface of the modified first fin structure, wherein a top surface of the masking material is coplanar with the top surface of the insulating layer and the top surface of the second fin structure.

11. A method of forming first and second fin field effect transistors (finFETs) on a substrate, the method comprising:

forming first and second pairs of fin structures of the first and second finFETs, respectively, on the substrate, wherein the first and second pairs of fin structures comprise semiconductive material;

wherein a fin-to-fin pitch of the first pair of fin structures is smaller than a fin-to-fin pitch of the second pair of fin structures;

depositing and planarizing a layer of insulating material on the substrate, wherein a top surface of the layer of insulating material is coplanar with top surfaces of the first and second pairs of fin structures;

depositing a hard mask layer on the top surfaces of the layer of insulating material and the second pair of fin structure;

modifying the first pair of fin structures such that a first vertical dimension of the first pair of fin structures is smaller than a second vertical dimension of the second pair of fin structures;

forming a polysilicon structure over the modified first pair of fin structures and the second pair of fin structures;

selectively forming a spacer on a sidewall of the polysilicon structure; and forming a dielectric layer under the polysilicon structure and the spacer.

12. The method of claim 11, wherein the fin-to-fin pitch of the first pair of fin structures ranges from about 18 nm to about 24 nm, and wherein the fin-to-fin pitch of the second pair of fin structures ranges from about 25 nm to about 34 nm.

13. The method of claim 11, wherein a difference between the first and second vertical dimensions ranges from about 20 nm to about 50 nm.

14. The method of claim 11, wherein the modifying the first pair of fin structures comprises:

depositing a layer of hard mask material on top surfaces of the first and second pairs of fin structures;

patterning the deposited layer of hard mask material to expose the top surfaces of the first pair of fin structures and to mask the top surfaces of the second pair of fin structures; and etching portions of the first pair of fin structures.

15. The method of claim 11, wherein the forming the dielectric layer under the polysilicon structure and the spacer comprises:

forming shallow trench isolation (STI) regions on the substrate;

depositing a layer of dielectric material on the modified first pair of fin structures, the second pair of fin structures, and the STI regions; and forming the polysilicon structure and the spacer on the layer of dielectric material; and etching portions of the layer of dielectric material that are on the modified first pair of fin structures, the second pair of fin structures, and the STI regions.

16. The method of claim 11, wherein the first and second pairs of fin structures consist of the semiconductive material.

17. A method of forming field effect transistors (finFETs) on a substrate, the method comprising:

forming first and second fin structures comprising semiconductive material on the substrate, wherein the first and second fin structures comprise respective first and second vertical dimensions about equal to each other;

depositing and planarizing a layer of insulating material on the substrate, wherein a top surface of the layer of insulating material is coplanar with top surfaces of the first and second fin structures;

depositing a layer of hard mask material on top surfaces of the first and second fin structures;

patterning the deposited layer of hard mask material to expose the top surface of the first fin structure and to mask the top surface of the second fin structure; and etching a portion of the first fin structure to form a modified first fin structure such that a modified first vertical dimension of the modified first fin structure is smaller than the second vertical dimension of the second fin structure.

18. The method of claim 17, wherein a difference between the modified first vertical dimension and the second vertical dimension ranges from about 20 nm to about 50 nm.

19. The method of claim 17, further comprising depositing a dielectric layer on the modified first fin structure and the second fin structure.

20. The method of claim 19, further comprising:
forming a polysilicon structure on the dielectric layer; and
selectively forming a spacer on a sidewall of the polysilicon structure.

* * * * *